(12) United States Patent
Sombrin et al.

(10) Patent No.: US 10,126,341 B2
(45) Date of Patent: Nov. 13, 2018

(54) PROCESS AND DEVICE FOR MEASURING INTERMODULATION PRODUCTS BY REFLECTION OF ELECTROMAGNETIC WAVES ON AN OBJECT

(71) Applicant: CENTRE NATIONAL D'ETUDES SPATIALES C N E S, Paris (FR)

(72) Inventors: Jacques Sombrin, Toulouse (FR); Isabelle Albert, Escalquens (FR); Geoffroy Soubercaze-Pun, Flourens (FR); Nicolas Capet, Toulouse (FR)

(73) Assignee: CENTRE NATIONAL D'ETUDES SPATIALES C N E S, Paris (FR)

( * ) Notice: Subject to any disclaimer, the term of this patent is extended or adjusted under 35 U.S.C. 154(b) by 480 days.

(21) Appl. No.: 14/833,731

(22) Filed: Aug. 24, 2015

(65) Prior Publication Data

US 2016/0061868 A1 Mar. 3, 2016

(30) Foreign Application Priority Data

Aug. 26, 2014 (FR) ...................................... 14 57996

(51) Int. Cl.
*G01R 29/10* (2006.01)
*H01Q 19/13* (2006.01)
*H01Q 19/19* (2006.01)

(52) U.S. Cl.
CPC ........... *G01R 29/10* (2013.01); *H01Q 19/132* (2013.01); *H01Q 19/19* (2013.01)

(58) Field of Classification Search
CPC combination set(s) only.
See application file for complete search history.

(56) References Cited

U.S. PATENT DOCUMENTS

| 6,144,492 | A | 11/2000 | Beck |
| 6,771,698 | B1 * | 8/2004 | Beck ................... G01R 29/105 |
| | | | 375/130 |
| 2012/0086612 | A1 * | 4/2012 | Linehan ................ H01Q 3/267 |
| | | | 343/703 |
| 2015/0188647 | A1 * | 7/2015 | Wang .................... H04B 17/00 |
| | | | 455/67.12 |

FOREIGN PATENT DOCUMENTS

EP    2 858 275 A1    4/2015

OTHER PUBLICATIONS

FR Search Report, dated May 8, 2015, from corresponding FR application.

* cited by examiner

*Primary Examiner* — Junpeng Chen
(74) *Attorney, Agent, or Firm* — Burris Law, PLLC

(57) ABSTRACT

A process and a device for measuring intermodulation products by wave reflection on a non-linear object (20), including two electromagnetic sources (24, 25) of distinct focal points emitting fundamental components, and a receiver (28), the process includes a step in which the measuring device is in a configuration so that the receiver (28) produces a signal for a first composition of the enriched wave (23), and a second step in which the measuring device is in a second configuration so that the receiver (28) produces a measuring signal for a second composition of the enriched wave (23).

20 Claims, 4 Drawing Sheets

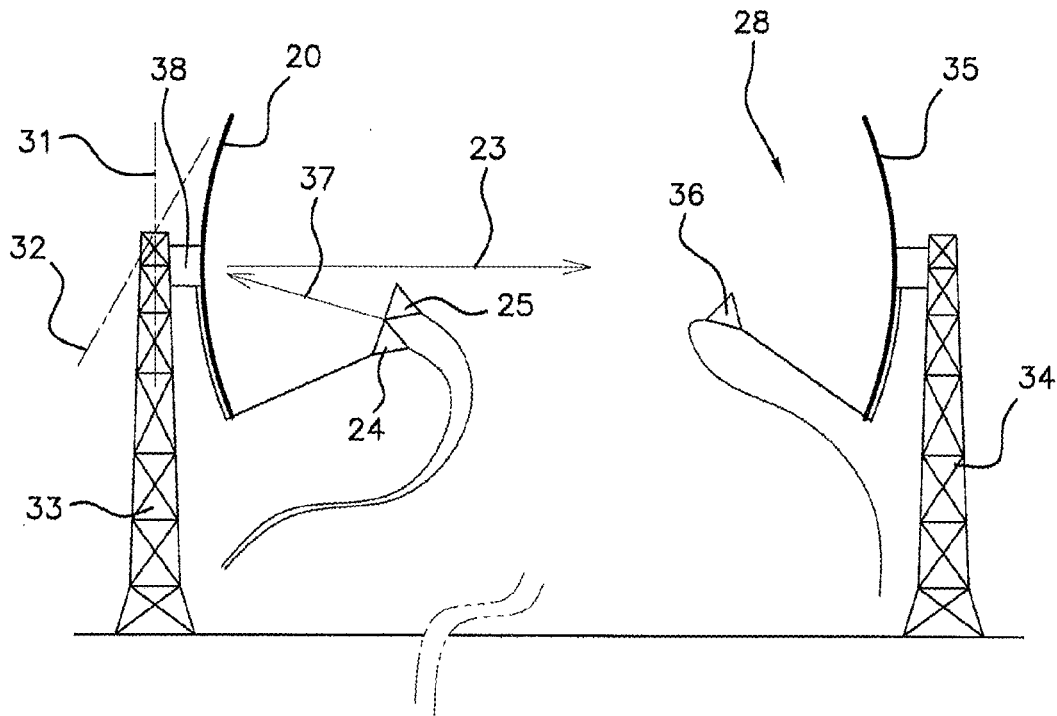
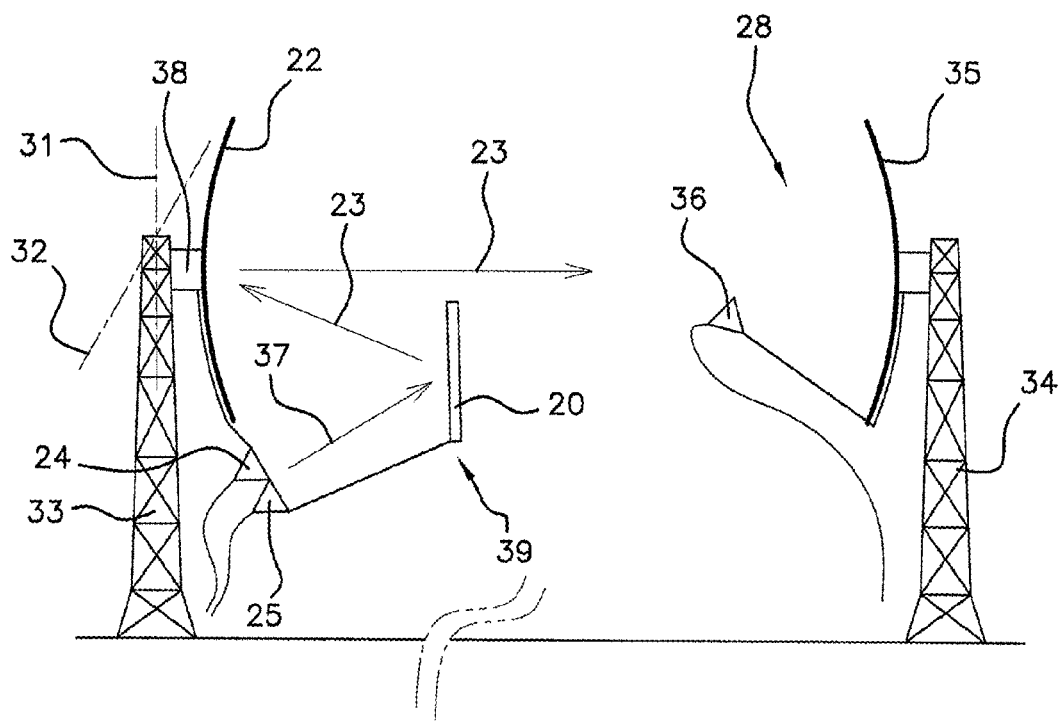

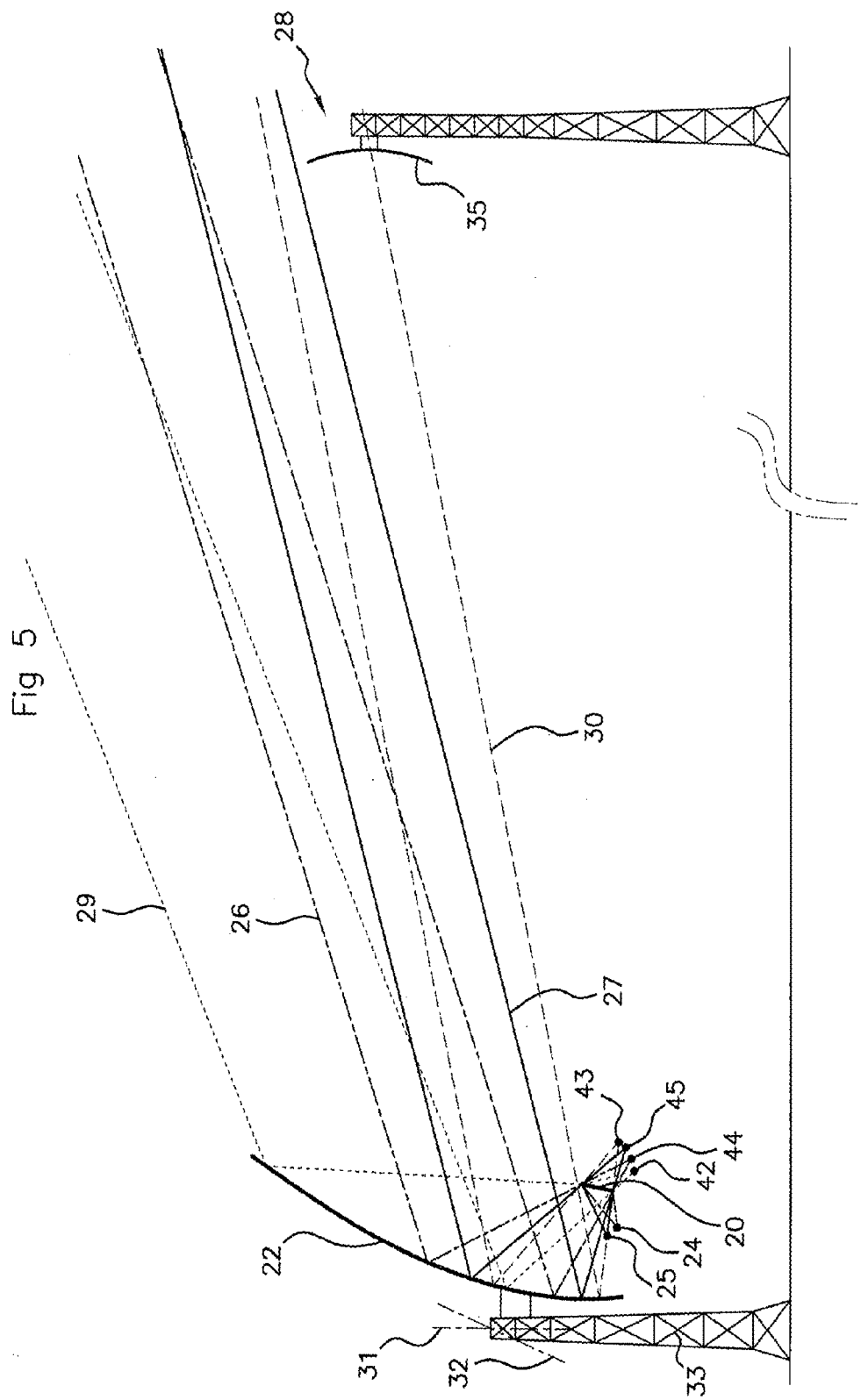

PROCESS AND DEVICE FOR MEASURING INTERMODULATION PRODUCTS BY REFLECTION OF ELECTROMAGNETIC WAVES ON AN OBJECT

FIELD OF THE INVENTION

The invention concerns a process and a device for power measurement of intermodulation products, in particular of the intermodulation products produced by wave reflection on an at least partially reflecting non-linear object.

BACKGROUND OF THE INVENTION

The phenomena of intermodulation appear for electromagnetic devices operating at several frequencies simultaneously when objects behaving in non-linear manner are located close by. Intermodulation is the result of distortions generated by these non-linear objects from an incident electromagnetic wave. Intermodulation manifests itself especially through the appearance of new components of frequencies in the electromagnetic wave. The frequencies of these intermodulation components are obtained by addition or subtraction of multiples of the frequencies that are present in the electromagnetic wave incident on said non-linear object. The result of the addition of the moduli of the multiplying factors of the frequencies of the incident electromagnetic wave that are used to obtain the frequency of an intermodulation component is designated by "order of intermodulation".

Generally it is sought to evaluate the power of distortions of passive intermodulation, because they cannot all be eliminated by filtering—unlike distortions of out-of-band active intermodulation (caused by active components). Now, the power of the passive intermodulation products becomes significant in electronic devices operating at high power levels.

It is therefore particularly important to determine the power of intermodulation products produced by non-linear objects situated in proximity to electromagnetic devices such as transmitting/receiving antennas, for example.

In fact, in electronic devices of broadband telecommunications, products of passive intermodulation that are derived from the transmission signals have frequencies in the reception band. This is the case all the more so, since the bands of radio frequencies for telecommunications are more and more densely occupied. Now, since the reception signals are always of lower power than the transmission signals, the products of passive intermodulation that are derived from the transmission signals may significantly add noise to the reception of information signals.

This is the case, for example, in devices for transmission/reception of long-range telecommunications signals that use a large number of carrier frequencies for transmission and for reception, and in broadband. This phenomenon is particularly inconvenient in telecommunications devices on board satellites, on board aircraft or, on the ground, in telecommunications relays for mobile phones. The phenomena of intermodulation are sufficiently important in this case to have led some manufacturers of satellites to duplicate their transmission/reception device, which represents a very high additional cost of manufacture and launch.

It is therefore essential to be able to evaluate and predict the power levels of these intermodulation products, in order to take them better into account when designing the device.

It is, in particular, essential to be able to measure the powers produced by an object in particular, especially by a sample of particular material.

In numerous processes for measuring intermodulation products produced by an object an electromagnetic wave is emitted by two antennas onto a reflector, and the wave reflected by said object is measured by a receiver. Such a process is accordingly described in U.S. Pat. No. 6,144,692. The receiver includes a demodulation device including a demultiplexer enabling a power measurement to be carried out of each component of the electromagnetic wave received by the receiver.

Such devices present numerous drawbacks. Accordingly, such a device does not enable measurements to be carried out in certain important frequency bands. Accordingly, it is not possible to carry out measurements at frequencies situated between those of two fundamental components forming an incident wave, nor at frequencies situated beyond the total pass-band of the demultiplexer. It is also impossible to measure powers of intermodulation products, the frequency of which is outside the reception band of the demultiplexer.

In addition, such demultiplexers themselves introduce products of passive intermodulation, and their quality greatly influences the cost of the measuring device.

The invention therefore aims to palliate these drawbacks.

The invention aims to propose a process for measuring intermodulation products enabling a measurement of intermodulation products to be carried out that is reliable and precise for any component of any frequency.

The invention also aims to propose such a process that is economical and simple.

SUMMARY OF THE INVENTION

The invention aims, in addition, to propose a device for measuring intermodulation products enabling a measurement to be carried out of intermodulation products produced by a non-linear object.

The invention also aims to propose a generic device that is capable of being used to perform measurements successively on several objects without modification of the measuring device.

Throughout the text, the power of an intermodulation product (of predetermined order and therefore of predetermined frequency) is designated by "intermodulation power". Such an intermodulation power may be expressed in watts (W), milliwatts (mW), or decibels relative to one milliwatt (dBm).

The invention therefore concerns a process for power measurement of intermodulation products produced by reflection of an electromagnetic wave on a non-linear object, in which:
  a first electromagnetic source emits a first electromagnetic wave including at least one component, named the first fundamental component, from a first focal point,
  a second electromagnetic source emits a second electromagnetic wave including at least one component, named the second fundamental component, from a second focal point which is distinct from the first focal point,
  said first electromagnetic wave and said second electromagnetic wave form an electromagnetic wave, named the emitted wave:
    propagating from said sources as far as said non-linear object at least,
    being at least partially reflected on said non-linear object and enriched in components, named the intermodulation components, corresponding to intermodulation products produced by said non-linear object from said first fundamental component and said second fundamental component of the emitted wave, in such a way as to form an electromagnetic wave, named the enriched wave, including the first fundamental component, the second fundamental component and said intermodulation components, said enriched wave is propagated, at least partly, from said non-linear object to at least one electromagnetic receiver, said process being characterised in that it comprises:

at least one step of displacement chosen from:

said object is displaced in rotation about at least one axis in relation to said receiver, at least between a first measuring position and a second measuring position, a reflector that is suitable to reflect an electromagnetic wave without enriching it in components is displaced in rotation about at least one axis in relation to said receiver, at least between a first measuring position and a second measuring position, and said receiver is displaced in translation along at least one direction which is distinct from a direction of incidence of said enriched wave on said receiver, at least between a first measuring position and a second measuring position, and at least one step in which said electromagnetic receiver produces at least one signal, named the measuring signal, that is representative at least of the power of at least one component of the enriched wave for said first position and at least one measuring signal for said second position.

In particular, the invention concerns a process for power measurement of intermodulation products produced by reflection of an electromagnetic wave on a non-linear object, in which use is made of a measuring device comprising:

a first electromagnetic source emitting from a first focal point a first electromagnetic wave including at least one component, named the first fundamental component, a second electromagnetic source emitting from a second focal point, distinct from the first focal point, a second electromagnetic wave including at least one component, named the second fundamental component, a non-linear object disposed in such a way as to be able to be irradiated by said first fundamental component and said second fundamental component, and to form an electromagnetic wave, named the enriched wave, including said first fundamental component, said second fundamental component, and components, named the intermodulation components, an electromagnetic receiving device that is suitable to produce at least one signal, named the measuring signal, that is representative at least of the power of at least one component of an electromagnetic wave received by this receiving device, the measuring device being arranged in at least one spatial configuration, named the measuring configuration, in which said enriched wave is propagated, at least partly, as far as the receiving device, characterised in that the enriched wave has a variable composition in space and comprises:

a first measuring step in which the measuring device is arranged in a first spatial configuration, named the first measuring configuration, that is suitable so that said receiving device produces at least one first measuring signal for a first part having a first composition of the enriched wave, and at least one second measuring step in which the measuring device is arranged in a second spatial configuration, named the second measuring configuration, distinct from said first measuring configuration, that is suitable so that said receiving device produces at least one second measuring signal for a second part having a second composition of the enriched wave which is distinct from the first composition of the enriched wave.

The emitted wave includes at least one component of each of the two electromagnetic sources. The enriched wave also includes at least one component of each of the two electromagnetic sources.

The inventors have ascertained that the components of passive intermodulation of an enriched wave that are produced by a non-linear object subjected to an electromagnetic wave ("emitted wave") comprising a plurality of electromagnetic components, named the fundamental components, derived from sources of distinct focal points have a direction of propagation in space which is distinct from that of the fundamental components reflected by said object. This is true, whether or not the first fundamental component and the second fundamental component which are derived from sources of distinct focal points are of the same frequency.

Said enriched wave is therefore not homogeneous in space; its composition varies in space. Results of measurements carried out on one or more components of the enriched wave therefore vary as a function of the position at which each measurement is performed in relation to the enriched wave.

In a process according to the invention at least one non-zero power component of the enriched wave is received by said receiver for said first measuring configuration, and at least one non-zero power component of the enriched wave is received by said receiver for said second measuring configuration, said power or said component being distinct in the first measuring configuration and in the second measuring configuration.

A measuring device according to the invention includes a plurality of elements, amongst which are at least: the two sources, the non-linear object, a receiving device, and optionally one or more simple reflectors interposed on the path of the electromagnetic wave between said sources and said receiving device.

A measuring configuration according to the invention corresponds to a spatial configuration—that is to say, a position and a spatial orientation—of each of the elements of the measuring device in relation to one another. It is a question especially of a functional spatial configuration enabling a power measurement to be carried out of components of the enriched wave formed by a linear object.

The measuring-configuration modifications may be discrete or continuous.

The receiving device includes at least one receiver and may include several of them.

Advantageously and according to the invention, said process is characterised in that it includes, in addition, a step of modification of the measuring configuration of said first measuring configuration to said second measuring configuration, this step of modification being chosen from:

a step of displacement of said non-linear object in rotation about at least one axis in relation to said receiving device, at least between a first measuring configuration and a second measuring configuration, a step of displacement of a reflector, suitable to reflect an electromagnetic wave without enriching it in components, in rotation about at least one axis in relation to said receiving device, at least between a first measuring configuration and a second measuring configuration, and a step of displacement of said receiving device in translation along at least one direction which is distinct from a direction of incidence of said enriched wave on said receiving device, at least between a first measuring configuration and a second measuring configuration, In accordance with the invention:

the non-linear object is pivoted in such a way as to scan a field in which at least one receiver is located, or a reflector disposed on the path of the enriched wave (that is to say, between the non-linear object and said receiver) is pivoted in such a way as to scan a field in which at least one receiver is located, or said receiver is displaced in a field of transmission of the enriched wave along a direction which is distinct from the direction of propagation of the reflected wave.

Advantageously and according to the invention, said process is characterised in that it includes, in addition, a step of modification of the configuration of the transmission system including at least one step of displacement chosen from:

a step of displacement of said non-linear object in rotation about at least two distinct axes in relation to said receiving device, a step of displacement of said reflector in rotation about at least two distinct axes in relation to said receiving device, and a step of displacement of said receiver in translation along at least two directions distinct from one another and each distinct from the direction of incidence of said enriched wave on said receiving device.

In a process in accordance with the invention there is nothing to prevent combining two or more of these alternatives.

The receiver is advantageously displaced in a cone of vertex angle less than 150°, especially advantageously of the order of 130°.

When said receiver is displaced, it is advantageously displaced along a direction forming an angle between 60° and 120° with the direction of incidence of the enriched wave—that is to say, the direction of propagation of the enriched wave when it encounters said receiver—in particular, advantageously along a direction orthogonal to the direction of propagation of the reflected wave.

Generally, in a process in accordance with the invention,
the first electromagnetic wave includes at least one component, named the first fundamental component, at a first frequency,
the second electromagnetic wave includes at least one component, named the second fundamental component, at a second frequency which is distinct from the first frequency.

The intermodulation components are of frequencies obtained by addition or subtraction of multiples of the fundamental frequencies, for example for two fundamentals of frequencies f1 and f2, intermodulation components of frequencies f2−f1, f1+f2; 2f2−f1, 2f1−f2; 2f2−2f1, 2f2+2f1; . . . are liable to be created. The order of an intermodulation component is calculated as the sum of the moduli of the multiplying coefficients applied to the frequencies f1 and f2 to obtain the frequency of said intermodulation component. The intermodulation component of frequency 2f2−f1, for example, is of order 3.

Now, the most inconvenient intermodulation components are generally the intermodulation components of uneven order, the frequencies of which are close to the frequencies of the fundamental components f1 and f2. They are filtered with difficulty and may be found in a reception band, especially in broadband, when the width of the transmission band is greater than 1% of the difference between the transmission frequency and the reception frequency. However, when the fundamental components have identical frequencies, intermodulation components are also produced that have a frequency identical to the fundamental components. The invention is also applicable advantageously to such intermodulation components. In fact, such components are particularly inconvenient, because they are necessarily at the same frequency as the useful frequencies (named the fundamentals). In particular, such intermodulation components at the same frequency as the fundamental components may be in phase shift, especially in phase opposition, with the fundamental components, so that they reduce the received power of the fundamental components. The invention presents the advantage of enabling their power and their spatial distribution to be determined.

The spatial filtering of the components is, furthermore, the sole means of separating and measuring the diverse components when the frequencies f1 and f2 are equal or close and also when all the frequencies of the uneven intermodulation components are of the form mf2−(m−1)f1 or mf1−(m−1)f2, with m a positive integer.

The invention enables powers of intermodulation components to be measured without electronic filtering. The invention especially enables a spatial filtering to be carried out of components, the power measurement of which is not useful or is inconvenient, in particular of the fundamental components, the power of which is normally very high in comparison with the powers of the intermodulation components. The invention enables, more particularly, the components of low order to be filtered to carry out power measurements on intermodulation components of higher order, which are normally of much lower power than said intermodulation components of low order.

The measuring signal produced by the receiver is advantageously representative at least of the power of at least one component of the enriched wave incident on at least one antenna of the receiver. The measuring signal may be representative of other information, such as the frequency of each component associated with the incident power of this component on the receiver. When the enriched wave is composed of several components, and several of these components are incident on the receiver, the measuring signal is advantageously representative of a plurality of—but not necessarily all—components of the incident enriched wave.

Advantageously and according to the invention, the frequencies of said first fundamental component and said second fundamental component are in a range of frequencies exhibiting an overlap of non-zero frequency with a passband of the non-linear object.

Moreover, advantageously and according to the invention, the frequencies of said first fundamental component and said second fundamental component are in the range of the radio frequencies.

The frequency of each fundamental component is advantageously lower than 300 GHz.

The object and each reflector disposed between each source and the receiver are advantageously at least partially reflecting in the range of the radio-frequency radiation— especially of frequency lower than 300 GHz.

The measuring signal is advantageously a digital signal. Advantageously and according to the invention, said first measuring configuration and said second measuring configuration are chosen so that the measuring signal of at least one component of the enriched wave incident on said receiver is distinct in the first measuring configuration and in the second measuring configuration.

Advantageously and according to the invention, at least one measuring configuration is chosen so that the power of at least one intermodulation component of the enriched wave can be measured reliably.

In a process according to the invention at least one measuring signal is advantageously produced by the receiving device for at least one measuring configuration in which the power of the enriched wave is lower than the saturation power of said receiving device.

The power of the enriched wave is a power per unit area, and it is compared to the maximum saturation power of said receiving device multiplied by the surface area of the receiver of the receiving device. The total power of the wave received by the receiving device has to be lower than the saturation power of said receiving device. An appropriate choice of measuring configuration makes this possible, notably by placing the receiving device in a zone of space in which the fundamental components of the enriched wave are of lesser power.

In at least one step of a process according to the invention at least one measuring signal is produced by the receiver for at least one measuring configuration in which a power measurement of an intermodulation component of the enriched wave can be performed without perturbation of the receiver (especially without perturbation of a spectrum analyser of the receiver) by other components of the enriched wave.

Accordingly, carrying out a spatial filtering of frequency according to the invention enables the receiver not to be saturated with frequency components, the measurement of which is not useful, and therefore enables a reliable power measurement of at least one intermodulation component to be obtained.

Moreover, advantageously in a process according to the invention at least one measuring signal is produced by the receiving device for a first measuring configuration in which the ratio of the power of the fundamental components to the power of an intermodulation component is less than the dynamic range of said receiving device.

This enables the power of said intermodulation component to be measured sufficiently reliably.

This condition is named compatible with the dynamic range of the receiver. Advantageously, if this dynamic range is greater than at least a ratio of 10 between the fundamental components and the measured intermodulation components, then the precision of measurement of the measured intermodulation components is better than 0.5 dB.

Moreover, advantageously in a process according to the invention at least one measuring signal is produced by the receiving device for a first measuring configuration in which the ratio of the power of a first intermodulation component to the power of a second intermodulation component is lower than the dynamic range of said receiving device.

This enables the power of said second intermodulation component to be measured sufficiently reliably. More particularly, in order to obtain more precise measurements a lower ratio may be chosen, in particular, for example, a ratio of the power of a first intermodulation component to the power of a second intermodulation component lower by 3 dB than the dynamic range of said receiving device.

In a current advanced device the dynamic range is about 70 dB. It would therefore suffice that the ratio of the power of a first intermodulation component to the power of a second intermodulation component is lower than 70 dB, and more particularly lower than 67 dB. Nevertheless, within the scope of the invention and if the dynamic range of receiving devices in accordance with the invention improves, there is nothing to prevent being able to carry out measurements with a ratio of the power of a first intermodulation component to the power of a second intermodulation component greater than 70 dB.

In a process according to the invention it is, in particular, possible to perform at least one measurement in at least one first measuring configuration in which the power of at least one fundamental component or of at least one intermodulation component of order 3 is measurable by the receiver, and at least one second measuring configuration in which at least one intermodulation component of order 5 is received by the receiver with a power compatible with the dynamic range of the receiver in relation to the power of any component of lower order, especially any fundamental component (order 1) and any intermodulation component of order 3. In this second measuring configuration the fundamental components are not incident on the receiver (the signal measurement for these components is representative of a zero power). Accordingly, in this second measuring configuration it is the intermodulation products of order 5 (amongst the products of uneven order) which are the most powerful, so their measurement can be performed reliably and precisely by the receiver. In fact, the intermodulation products of order 5 are then not made noisy by more powerful components such as the fundamental components or the intermodulation components of order 3. In the enriched wave incident on the receiver there only continue to exist components of order lower than the trace amounts (fundamentals and order 3) and intermodulation components of higher order (7, 9, etc.) and therefore, they too, of much lower power.

Likewise, a power measurement of at least one intermodulation component of order 3 is advantageously carried out in a measuring configuration in which the fundamental components are not incident on the receiver (that is to say, the signal measurement for the fundamental components is representative of a power that is compatible with the dynamic range of the receiver in relation to the power of said intermodulation component of order 3).

Accordingly, the power of a plurality of intermodulation components can be measured without being made significantly noisy by components of more considerable power.

Advantageously and according to the invention, at least one measuring configuration is chosen in a manner depending on at least one intermodulation component, the power measurement of which in said enriched wave is useful.

In fact, the displacement of at least one element chosen from the object, a reflector or the receiver enables certain components of the enriched wave to be spatially filtered. The measuring configuration has an influence on the components that are present in the enriched wave incident on the receiver. To measure the power of a predetermined intermodulation component, a predetermined measuring configuration is chosen in which the fundamental components and the intermodulation components of order lower than said predetermined intermodulation component are of much lower power than the power of said predetermined intermodulation component in the enriched wave incident on the receiver. Advantageously, in a process according to the invention at least one series of measurements is carried out, corresponding to the production of a plurality of measuring signals by said receiver, each measuring signal being representative of the power of at least one component of the enriched wave incident on said receiver.

Advantageously and according to the invention, several measuring signals are produced for a measuring configuration and are representative of the power of a plurality of components of the enriched wave.

Advantageously and according to the invention, a measuring signal that is representative of the power of at least one component of the enriched wave is produced for two distinct measuring configurations. Several measuring signals are accordingly produced for several distinct measuring configurations, and each measuring signal is representative of the power of at least the same component of the enriched wave for these various measuring configurations.

It is accordingly possible, by virtue of a process according to the invention, to carry out a power mapping of one or more components of a wave enriched in intermodulation components.

Advantageously and according to the invention, a step equivalent to the displacement of a receiver along a direction which is distinct from the direction of propagation of the enriched wave for carrying out a series of measurements is carried out by the production of a plurality of measuring signals by a plurality of receivers disposed in the field of the enriched wave, each receiver being disposed according to a fixed measuring configuration which is distinct from the measuring configuration of the other receivers. In particular, a plurality of receivers according to the invention are interconnected and/or connected to a collecting centre for measuring signals in such a way as to form a network of receivers. Accordingly, for example, in a process according to the invention it is possible to envisage that each receiver produces a measuring signal that is representative of the power of a component of the reflected wave, the other receivers producing a measuring signal that is representative of the power of another component of the reflected wave.

Accordingly, in some embodiments according to the invention each receiver is fixed in a reference frame—notably the terrestrial reference frame—and said non-linear object and/or a reflector, named the pivoting reflector, is capable of pivoting about at least one axis in this same reference frame. There is nothing to prevent making provision for implementing the invention in other reference frames, such as a frame of an anechoic chamber, for example.

In particular, the pivoting reflector is motorised in rotation about at least one axis, and its angular position about this axis is controlled.

In particular, in these embodiments the last reflector on the path of the electromagnetic wave between said sources and each receiver is mounted so as to be mobile in rotation about at least one axis. Advantageously, only the last reflector on the path of the electromagnetic wave between said sources and each receiver is mounted so as to be mobile in rotation about at least one axis. It is therefore the reflector directly opposite an antenna of the receiver which is displaced in rotation about at least one axis.

Advantageously and according to the invention, at least one axis of rotation of the pivoting reflector is vertical, so that the rotation of the pivoting reflector about its axis of rotation brings about a scanning by the enriched wave of a plane that is parallel overall to the terrestrial surface, the receiver being advantageously located in an angular sector scanned in this way by the enriched wave.

Moreover, advantageously and according to the invention said pivoting reflector is displaced in rotation about at least two distinct axes in relation to said receiver.

The inventors have ascertained that the intermodulation products are not necessarily all emitted by the non-linear object in a plane of incidence of the enriched wave on said non-linear object. Consequently, a spatial filtering by rotation of the pivoting reflector about a second axis is particularly advantageous.

The pivoting reflector enables at least one angular sector of space along a plane that is parallel overall to the terrestrial surface and at least one angular sector of space along a plane that is perpendicular overall to the terrestrial surface to be scanned with the enriched wave. More particularly, advantageously and according to the invention the first axis of rotation of the pivoting reflector and the second axis of rotation of the pivoting reflector are mutually orthogonal. Advantageously and according to the invention, the first axis of rotation of the pivoting reflector is a vertical axis, and the second axis of rotation of the pivoting reflector is horizontal.

Such rotations enable notably the intermodulation products produced by a non-linear object subjected to a multi-frequency and multisource electromagnetic wave to be characterised better: in particular, the power and the direction of the intermodulation products introduced into the emitted wave by such an object.

Alternatively or in combination, in other embodiments according to the invention the receiver (in particular, an antenna of the receiver) is displaced along at least one direction which is distinct from the direction of propagation of the enriched wave.

The receiver is advantageously displaced in translation along a direction orthogonal to the direction of propagation of the enriched wave.

In particular, the receiver is advantageously displaced in a plane that is perpendicular overall to the direction of propagation of the wave in such a way as to carry out a series of measurements in distinct measuring configurations, and accordingly to carry out a mapping of the power of at least one intermodulation component, advantageously of several intermodulation components, and, if need be, of the fundamental components.

The non-linear object is, for example, chosen from a sample of material and a non-linear reflector. The non-linear reflector may, for example, be covered by a non-linear material or constituted by a fabric of carbon fibres. Such a reflector is, for example, of parabolic form or parabola-shaped.

Advantageously, the non-linear object is disposed in proximity to the first source and the second source.

In particular, in an experimental device, when the non-linear object is of parabolic type (or parabola-shaped), the sources are advantageously disposed close to the focal point at a distance from the focal point less than the focal distance in such a way as to favour the focusing of the various components.

Advantageously, in a process according to the invention the non-linear object directly receives the wave emitted by the sources and returns it in the form of a wave enriched in intermodulation components towards a reflector which reflects this enriched wave towards said receiver. Said reflector is advantageously a pivoting reflector.

Advantageously and according to the invention, the sources, the non-linear object and a parabola-shaped reflector are disposed so that each virtual source of the fundamental components is in proximity to the focal point of said parabola-shaped reflector.

Furthermore, advantageously and according to the invention the first source and the second source are integral in rotation with said object, so that the relative position of each source in relation to said object is constant.

Advantageously and according to the invention, alternatively or in combination the first source and the second source are integral in rotation with said reflector, so that the relative position of each source in relation to said reflector is constant.

More particularly, advantageously and according to the invention each source is displaced integrally in rotation with said non-linear object and said parabola-shaped reflector.

Accordingly, by a rotation of the pivoting reflector about at least one axis in relation to the receiver said sources are simultaneously displaced—integrally with said pivoting reflector—so that they, and also the virtual sources of the fundamental components and of the intermodulation components, preserve their position close to the focal point of said parabolic pivoting reflector, and so that the form of the enriched wave is identical, whatever the angular position of the pivoting reflector. Advantageously and according to the invention, the sources are disposed in relation to the pivoting reflector so that each virtual source—generally of distinct origin(s) from the real sources of fundamental components—of the intermodulation components is disposed at a distance from the focal point of said parabolic pivoting reflector that is suitable so that the enriched wave emitted by the parabolic pivoting reflector can be considered to be focused by the reflector, at least at the time of its reception by a receiver. The real sources (of the fundamental components) and the virtual sources (of the intermodulation components) are accordingly all disposed in proximity to the focal point of the parabolic pivoting reflector.

The invention also extends to a device that is suitable to be able to implement a process according to the invention.

The invention extends especially to a device for power measurement of intermodulation products produced by electromagnetic-wave reflection on a non-linear object, comprising:
 a first electromagnetic source that is suitable to emit a first electromagnetic wave including at least one component, named the first fundamental component, from a first focal point,
 a second electromagnetic source that is suitable to emit a second electromagnetic wave including at least one component, named the second fundamental component, from a second focal point which is distinct from the first focal point,
said first electromagnetic wave and said second electromagnetic wave together forming an electromagnetic wave, named the emitted wave,
 said non-linear object disposed in such a way as to be able to reflect said emitted wave and to enrich it in components, named the intermodulation components, corresponding to intermodulation products produced by said non-linear object from said first fundamental component and said second fundamental component,
said device being characterised in that it includes at least one mobile element chosen from:
 said object which is mobile in rotation about at least one axis in relation to said receiver, at least between a first position and a second position,
 a reflector that is suitable to reflect an electromagnetic wave without enriching it in components and that is mobile in rotation about at least one axis in relation to said receiver, at least between a first position and a second position,
 said receiver which is mobile in translation along at least one direction which is distinct from a direction of incidence of said enriched wave on said receiver, at least between a first position and a second position,
and in that said receiver is suitable to produce at least one signal, named the measuring signal, that is representative at least of the power of at least one component of the enriched wave for said first position and at least one measuring signal for said second position.

In particular, the invention extends to a device for power measurement of intermodulation products produced by electromagnetic-wave reflection on a non-linear object, comprising:
 a first electromagnetic source that is suitable to emit from a first focal point a first electromagnetic wave including at least one component, named the first fundamental component,
 a second electromagnetic source that is suitable to emit from a second focal point, distinct from the first focal point, a second electromagnetic wave including at least one component, named the second fundamental component,
 a non-linear object disposed in such a way as to be able to be irradiated by said first fundamental component and said second fundamental component, and to form an electromagnetic wave, named the enriched wave, including said first fundamental component, said second fundamental component, and components, named the intermodulation components,
 an electromagnetic receiving device that is suitable to produce at least one signal, named the measuring signal, that is representative at least of the power of at least one component of an electromagnetic wave received by this receiving device,
the measuring device being arranged in at least one spatial configuration, named the measuring configuration, that is suitable so that said enriched wave is propagated, at least partly, as far as the receiving device,
characterised in that the enriched wave has a variable composition in space and is suitable to be able to change measuring configuration between a first spatial configuration, named the first measuring configuration, in which the receiving device receives a first part having a first composition of the enriched wave, and at least one second spatial configuration, named the second measuring configuration, distinct from said first measuring configuration, in which said receiving device produces at least one second measuring signal in which the receiving device receives a second part having a second composition of the enriched wave which is distinct from the first composition of the enriched wave.

A device according to the invention is also characterised in that it includes, in addition:
 a device, named the positioning device, that is suitable to produce digital data, named position data, that are representative of the measuring configuration,
 a data-processing unit that is suitable, for any measuring configuration, to be able to receive, and record in a memory, position data in a manner correlated with digital data, named measuring data, that are representative of at least one measuring signal produced by said receiver for a measuring configuration in which said position data have been produced.

Accordingly, each measuring signal is associated with a measuring configuration, enabling the non-linear object to be characterised. In fact, by virtue of a device according to the invention, in a process in accordance with the invention the power of at least one intermodulation component is measured and is associated with a measuring configuration, in this way enabling the direction and the power of the intermodulation components introduced by a non-linear object into an electromagnetic wave having at least two components to be determined.

Moreover, in a device according to the invention the first source and the second source are advantageously mounted so as to be integral in rotation with said non-linear object.

Moreover, in a device according to the invention the first source and the second source are advantageously mounted so as to be integral in rotation with said mobile element which is mounted in rotation about at least one axis, said mobile element being either the non-linear object or a reflector interposed on the path of the enriched wave between the non-linear object and the receiver.

Advantageously, a device according to the invention comprises solely said non-linear object, disposed on the path of the emitted wave between the sources and the receiver, and a pivoting reflector disposed on the path of the enriched wave between the non-linear object and the receiver.

Said pivoting reflector, the non-linear object and the sources are advantageously mounted so as to be integral in rotation, so that their relative spatial configuration is constant for any angular position of the pivoting reflector.

Furthermore, advantageously and according to the invention the distance between the receiver and the last reflector of the guidance device is greater than the diameter of this reflector divided by the tangent of the angle between the directions of the waves having the fundamental frequencies (i.e. 57 times the diameter for an angle of 1° and 573 times the diameter for an angle of 0.1°). It is accordingly possible to use an existing base installation for measuring an antenna of a length from a few tens of meters to a few hundred meters or more.

The invention also concerns a process and a device that are characterised, in combination, by all or some of the characteristics mentioned above or below.

BRIEF DESCRIPTION OF THE DRAWINGS

Other objectives, characteristics and advantages of the invention will become apparent from the following description which is non-limiting and which refers to the attached Figures, in which:

FIG. 1 is a schematic representation of a device for power measurement of intermodulation products produced by wave reflection on an at least partially reflecting non-linear object, enabling a process according to the invention to be implemented according to a first embodiment in accordance with the invention, FIG. 2 is a schematic representation of a device for power measurement of intermodulation products produced by wave reflection on an at least partially reflecting non-linear object, enabling a process according to the invention to be implemented according to a second embodiment in accordance with the invention, FIG. 5 is a schematic representation of a device in accordance with FIG. 2.

DETAILED DESCRIPTION OF THE INVENTION

Figure 3:
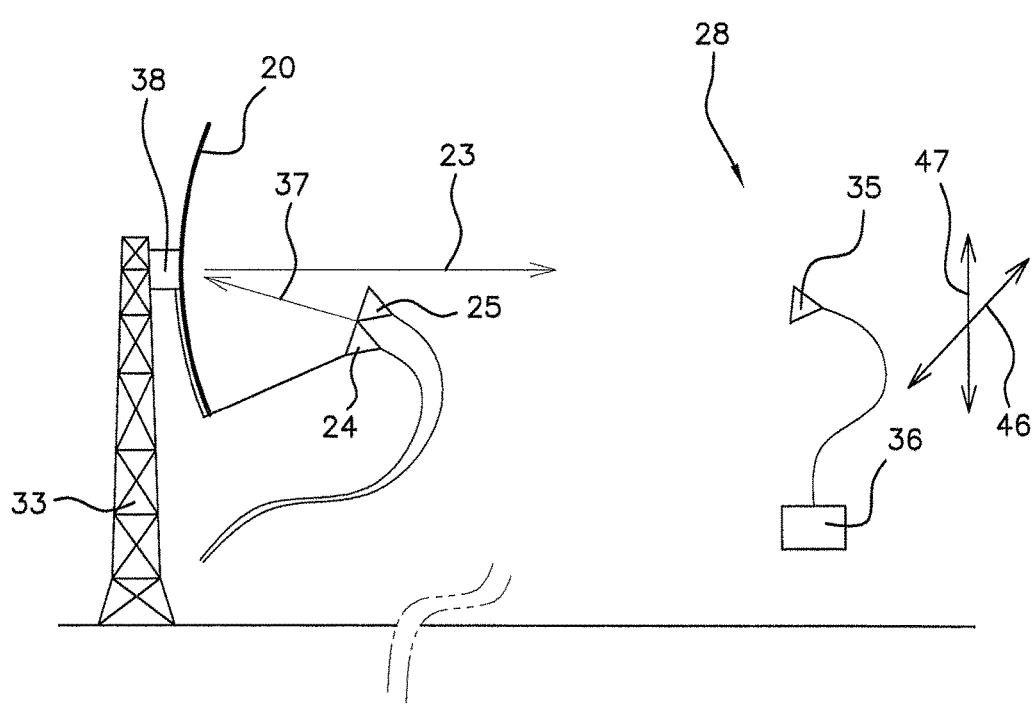
FIG. 3 is a schematic representation of a device in accordance with FIG. 1 in which the receiver is mobile.

In a device according to the invention as represented in FIG. 1 a first electromagnetic source 24 and a second electromagnetic source 25 are disposed with distinct focal points opposite a reflector 20.

The first source 24 emits an electromagnetic wave including at least one first component, named the fundamental component, of frequency f1. The second source 25 emits an electromagnetic wave including at least one second fundamental component of frequency f2, distinct or not from frequency f1.

Accordingly, an electromagnetic wave, named the emitted wave 37, constituted by the electromagnetic waves emitted by the first source and by the second source—therefore including at least one fundamental component of frequency f1 and a fundamental component of frequency f2—is emitted in the direction of the reflector 20.

In the embodiment represented in FIG. 1 the reflector is, for example, of parabola-shaped form.

The reflector 20 is made of a material or is covered by a material, the electromagnetic behaviour of which has to be tested. It therefore constitutes the non-linear object 20 at least partially reflecting electromagnetic waves, which creates intermodulation products from the fundamental components of the emitted wave 37.

Intermodulation components are therefore added by the reflector 20 to the emitted wave 37 incident on said reflector 20, so that an electromagnetic wave, named the enriched wave 23, including said fundamental components and intermodulation components, is returned by the reflector 20.

The reflector 20 is mounted on a pylon 33, articulated in rotation about two orthogonal distinct axes 31, 32. The reflector 20 is capable of pivoting about a vertical axis 31 and capable of pivoting about a horizontal axis 32.

The angular position of the reflector 20 about each axis is advantageously measured by a device, named the positioning device 38, that is suitable to produce digital data, named position data, that are representative of its angular position about each axis 31, 32.

The rotation of the reflector 20 about the two axes is advantageously motorised by the positioning device 38.

The sources 24, 25 are mounted so as to be integral in rotation with the reflector 20.

The reflector 20 is advantageously oriented so that at least a part of the enriched wave 23 is emitted in the direction of a receiver 28.

Said receiver includes a receiving antenna 35, mounted on a pylon 34 so as to be fixed. Said receiver 28 includes a receiving unit 36 that is suitable to transform a portion, incident on said antenna 35, of the enriched wave 23 into electrical signals—analogue or digital—that are representative at least of the power of a plurality of the components (advantageously, each component) contained in said incident portion of enriched wave 23.

The reflector 20 is mounted so as to rotate about the vertical axis 31 to be able to scan an angular sector of space in a horizontal plane, and about the horizontal axis 32 to be able to scan an angular sector of space in a vertical plane.

The device includes, in addition, a data-processing unit (not represented) which stores the power of each measured component of the enriched wave 23 received by said receiver 28 for a given angular position of the reflector 20.

In a process according to the invention this operation is repeated for a plurality of distinct angular positions of the reflector 20. Advantageously, the same processing unit controls the angular position of the reflector 20; in particular, it sends control signals to the positioning device 38.

Accordingly, a device and a process according to the invention enable the power of each intermodulation component emitted by a non-linear object 20 to be determined. In particular, the invention enables the power of intermodulation components to be measured reliably and precisely by spatially filtering the fundamental components and intermodulation components of lower rank (therefore of higher power) by a simple rotation of the reflector 20.

A second embodiment of the invention is presented in FIG. 2.

The emitter 39 includes a parabolic reflector 22 that is suitable to reflect an electromagnetic wave substantially faithfully—notably to reflect an electromagnetic wave without substantially introducing any intermodulation component into it. As in the first embodiment presented in FIG. 1, the parabolic reflector 22 is motorised in rotation about a vertical axis 31 and a horizontal axis 32.

The sources 24, 25 of emission of an emitted wave 37 including at least two fundamental components are disposed opposite a non-linear object 20. The sources 24, 25 and the non-linear object 20 are disposed so that the emitted wave 37 is at least partially reflected by said non-linear object 20 in the direction of the parabolic reflector 22.

The non-linear object 20 is a sample of a material, the behaviour of which has to be tested. The non-linear object 20 introduces intermodulation components into the incident emitted wave 37 derived from the sources 24, 25. The non-linear object 20 re-emits an electromagnetic wave, named the enriched wave 23, including the fundamental components and intermodulation components, in the direction of the reflector 22.

The sources 24, 25 and the non-linear object 20 are mounted so as to be integral in rotation with the parabolic reflector 22.

A third embodiment of the invention is presented in FIG. 3.

This embodiment is identical to the first embodiment corresponding to FIG. 1 in all points, with the exception that:
the non-linear object 20 and the sources are fixed,
the receiver 28 is mobile, in particular mobile in translation.

The receiver 28 includes a receiving antenna 35 and a receiving unit 36 that is suitable to transform a portion, incident on said antenna 35, of the enriched wave 23 into electrical signals—analogue or digital—that are representative at least of the power of a plurality of the components (advantageously, each component) contained in said incident portion of enriched wave 23.

In a process in accordance with the invention the receiver 28 is advantageously displaced by a translation along at least one first direction 46 substantially locally parallel to the terrestrial surface and orthogonal to the direction of propagation of the enriched wave 23.

The receiver 28 is advantageously also mobile along a second direction 47 substantially locally vertical to the terrestrial surface and orthogonal to the direction of propagation of the enriched wave 23.

Accordingly, a series of measurements can be carried out for various positions of the receiver, enabling, in particular at certain positions, the power of at least one intermodulation component to be measured without being inconvenienced by the power of a fundamental component.

Figure 4:
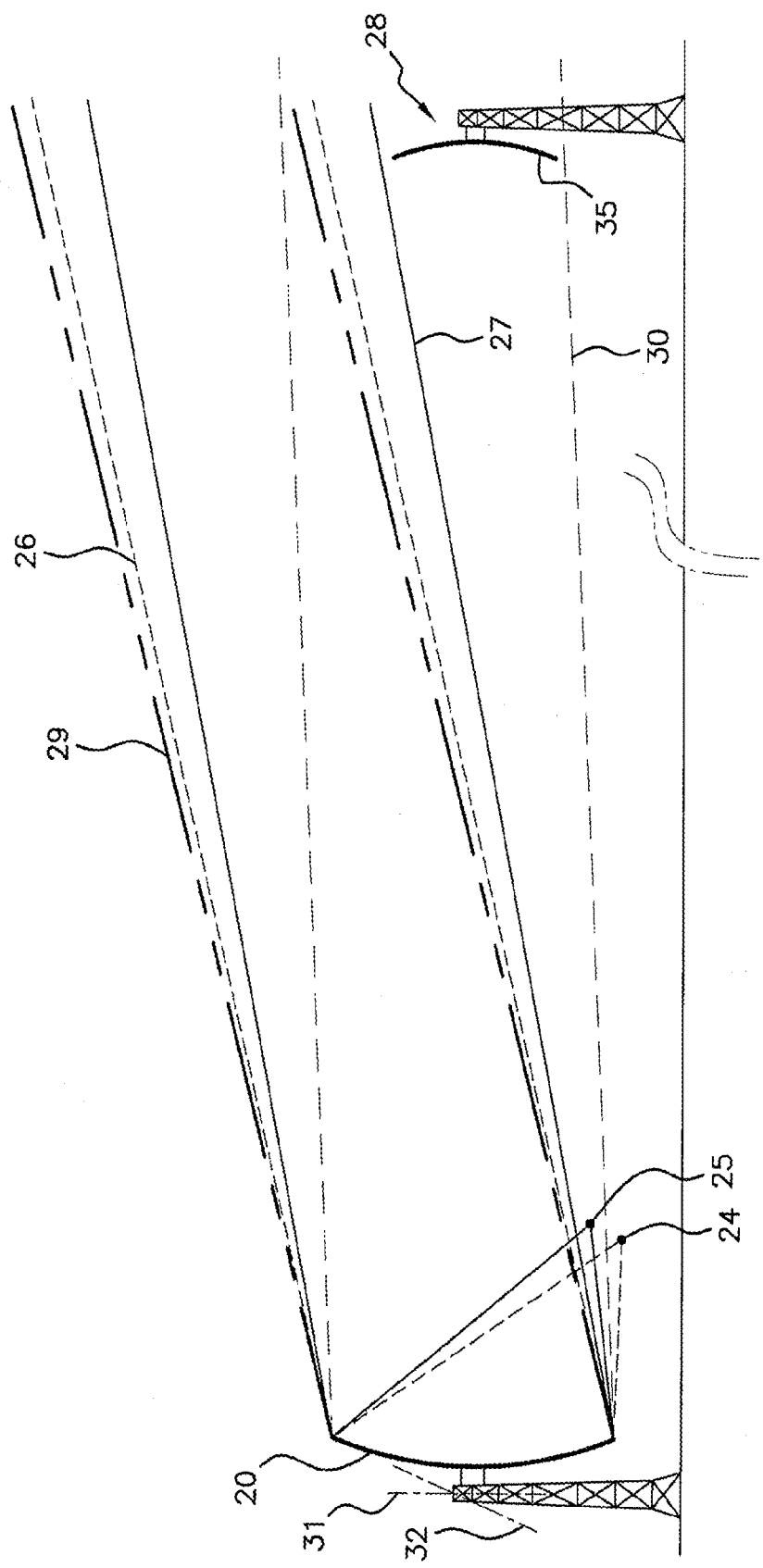
FIG. 4 is a schematic representation of a device in accordance with FIG. 1.

In FIG. 4 the device according to the first embodiment presented in FIG. 1 is represented in a measuring configuration—that is to say, with a predetermined angular position of the reflector 20.

The first source 24 emits a single fundamental component of frequency f1, and the second source 25 emits a single fundamental component of frequency f2. The envelope of the fundamental components is represented in longitudinal section. More particularly, the envelope 26 of the component of frequency f1 is represented in dashed lines, and the envelope 27 of the component of frequency f2 is represented in solid lines.

In addition, the envelopes of two intermodulation components created by the non-linear object in the form of parabola-shaped reflector 20 are also represented in longitudinal section. Accordingly, the envelopes of the intermodulation components of order 3: the envelope 29 of a component of frequency f3a=2f1−f2, and the envelope 30 of a component of frequency f3b=2f2−f1, are represented.

The reflector 20 is represented in an angular position that is suitable to enable the components of frequencies f1, f2 and f3a of the enriched wave 23 incident on the antenna 35 of the receiver 28 to be filtered, whereas the intermodulation component of frequency f3b is incident on the antenna 35 of the receiver 28.

In fact, the intermodulation component of frequency f3b is emitted by the object 20 in a direction slightly distinct from the directions taken by the other components of the enriched wave 23.

All the components of frequencies of the wave 23 have powers that are compatible with the dynamic range of the receiver at this angular position of the reflector 20, and the intermodulation components of higher order than the intermodulation component of frequency f3b can be easily separated from the component of frequency f3b which is more powerful than the components of higher order.

In FIG. 5 the device according to the second embodiment presented in FIG. 2 is represented in a measuring configuration—that is to say, with a predetermined angular position of the reflector 22.

The first source 24 emits a single fundamental component of frequency f1, and the second source 25 emits a single fundamental component of frequency f2. The envelope of the fundamental components is represented in longitudinal section. More particularly, the envelope 26 of the component of frequency f1 and the envelope 27 of the component of frequency f2 are represented in dot-dash lines and, respectively in solid lines.

The sources 24, 25 emit an electromagnetic wave, named the emitted wave 37, in the direction of a sample of non-linear object 20, this latter reflecting the emitted wave 37, enriched in intermodulation components, towards the parabola-shaped reflector 22.

The envelopes of four intermodulation components created by the non-linear object 20 are also represented in longitudinal section.

Accordingly, the envelopes of the intermodulation components of order 3: the envelope 29 of a component of frequency f3a=2f1−f2 and the envelope 30 of a component of frequency f3b=2f2−f1, are represented by dashed lines.

By symmetry in relation to the non-linear object 20, the fundamental components and the intermodulation components arrive at the reflector 22 from virtual sources.

Accordingly, the virtual sources 42, 43, 44, 45, respectively of the intermodulation component of frequency f3a, of the intermodulation component of frequency f3b, of the fundamental component of frequency f1, and of the fundamental component of frequency f2, are represented in FIG. 5. The sources 24, 25 are disposed in relation to the non-linear object 20 so that their virtual sources 44, 45 are in proximity to the focal point of the parabolic reflector 22.

Other intermodulation components of the same order exist, for example at order 3 f3c=2f2+f1, f3d=2f1+f2, or, for example, at order 5 of frequency f5c=4f1−f2, f5d=4f2−f1, f5e=3f1+2f2, etc. The reflector 22 is represented in an angular position that is suitable to enable the components of frequencies f1, f2 and f3a of the enriched wave 23 incident on the antenna 35 of the receiver 28 to be filtered, whereas the intermodulation component of frequency f3b is incident on the antenna 35 of the receiver 28.

In fact, the intermodulation component of frequency f3b is emitted by the non-linear object 20 in a direction slightly distinct from the directions taken by the other components of the enriched wave 23; in particular, it is re-emitted with an angle of reflection smaller than the angles of reflection of the fundamental components and of the second component of order 3 (of frequency f3a).

Only intermodulation components of higher order than the intermodulation component of frequency f3b are therefore liable to be incident on the receiver. They can easily be separated from the component of frequency f3b which is the most powerful component.

The displacement of the reflector 22 in rotation about the horizontal axis 32 in a first direction enables this intermodulation component of frequency f3b to be eliminated and enables the power of intermodulation components of higher order (5, 7, 9, etc.) to be measured. The displacement of the reflector 22 in rotation about the horizontal axis 32 in a second direction opposed to the first direction enables a non-zero power for the fundamental component of frequency f2 to be found, then a non-zero power for the fundamental component of frequency f1, then a non-zero power for the intermodulation component of frequency f3a.

By moving the receiver 28 sufficiently away from the pivoting reflector 22, it is possible to measure the power of a single component (fundamental component or intermodulation component) at the same time.

The invention may be the subject of numerous other embodiment variants which are not represented.

In particular, the number of reflectors on the path of the electromagnetic wave between the sources and each receiver may be different, in particular greater than one or two.

In addition, the number of sources may be greater than two.

Likewise, the number of fundamental components in the emitted wave (prior to incidence on the non-linear object) may be greater than two, and/or the number of fundamental components emitted by each source may be greater than one.

There is nothing, either, to prevent providing a receiving unit disposed in proximity to the sources, in order to measure the power of each component of the emitted wave reflected directly in the direction of the sources.

The invention claimed is:

1. A process for power measurement of intermodulation products produced by reflection of an electromagnetic wave on a non-linear object, using a measuring device including:
   a first electromagnetic source emitting from a first focal point a first electromagnetic wave including at least one first fundamental component,
   a second electromagnetic source emitting from a second focal point, distinct from the first focal point, a second electromagnetic wave including at least one second fundamental component,
   a non-linear object disposed to be irradiated by said first fundamental component and said second fundamental component, and to form an electromagnetic wave that is an enriched wave that includes said first fundamental component, said second fundamental component, and intermodulation components, and
   an electromagnetic receiving device configured to produce at least one measuring signal that is representative at least of the power of at least one component of the enriched wave received by the receiving device,
   the measuring device being disposed in at least one spatial measuring configuration, in which said enriched wave is propagated, at least partly, as far as the receiving device, the enriched wave having a variable composition in space, the process comprising:
   emitting, from the first and second electromagnetic sources to the non-linear object, the first and second electromagnetic waves to form the enriched waved; and
   producing, at the receiving device, at least one first measuring signal for a first part having a first composition of the enriched wave in a first measuring step in which the measuring device is arranged in a first spatial configuration that is a first measuring configuration, wherein the at least one first measuring signal is representative of the power of at least one component of the first part of the enriched wave; and
   producing, at the receiving device, at least one second measuring signal for a second part having a second composition of the enriched wave which is distinct from the first composition of the enriched wave in a second measuring step in which the measuring device is arranged in a second spatial configuration that is a second measuring configuration, wherein the at least one second measuring signal is representative of the power of at least one component of the second part of the enriched wave.

2. The process as claimed in claim 1 further comprising modifying the first measuring configuration to said second measuring configuration, the modifying the first measuring configuration to the second measuring configuration comprising one of:
   displacing said non-linear object in rotation about at least one axis in relation to said receiving device, at least between a first measuring configuration and a second measuring configuration,
   displacing a reflector configured to reflect an electromagnetic wave without enriching the electromagnetic wave in components, in rotation about at least one axis in relation to said receiving device, at least between a first measuring configuration and a second measuring configuration, and
   displacing said receiving device in translation along at least one direction which is distinct from a direction of incidence of said enriched wave on said receiving device, at least between a first measuring configuration and a second measuring configuration.

3. The process as claimed in claim 1, wherein:
   the first electromagnetic wave includes the first fundamental component, at a first frequency, and
   the second electromagnetic wave includes the second fundamental component, at a second frequency which is distinct from the first frequency.

4. The process as claimed in claim 3, wherein the frequencies of said first fundamental component and said second fundamental component are in the range of the radio frequencies.

5. The process as claimed in claim 1, wherein at least one of the measuring signals is produced by the receiving device for at least one measuring configuration in which the power of the enriched wave is lower than the saturation power of said receiving device.

6. The process as claimed in claim 1, wherein at least one of the measuring signals is produced by the receiving device for a measuring configuration in which the ratio of the power of a first intermodulation component to the power of a second intermodulation component is less than the dynamic range of said receiving device.

7. The process as claimed in claim 1 further comprising displacing an object, the displacing the object comprising one of:
displacing said non-linear object in rotation about at least two distinct axes in relation to said receiving device,
displacing a reflector in rotation about at least two distinct axes in relation to said receiving device, and
displacing said receiving device in translation along at least two directions distinct from one another and each distinct from the direction of incidence of said enriched wave on said receiving device.

8. The process as claimed in claim 1, wherein the first electromagnetic source and the second electromagnetic source are integral in rotation with said non-linear object so that the relative position of each source in relation to said non-linear object is constant.

9. The process as claimed in claim 2, wherein the first electromagnetic source and the second electromagnetic source are integral in rotation with said reflector so that the relative position of each electromagnetic source in relation to said reflector is constant.

10. The process as claimed in claim 2, wherein:
the first electromagnetic wave includes the first fundamental component at a first frequency, and
the second electromagnetic wave includes the second fundamental component at a second frequency which is distinct from the first frequency.

11. The process as claimed in claim 10, wherein the frequencies of said first fundamental component and said second fundamental component are in the range of the radio frequencies.

12. The process as claimed in claim 2, wherein at least one of the measuring signals is produced by the receiving device for a measuring configuration in which the ratio of the power of a first intermodulation component to the power of a second intermodulation component is less than the dynamic range of said receiving device.

13. The process as claimed in claim 2, further comprising displacing an object, the displacing the object comprising one of:
displacing said non-linear object in rotation about at least two distinct axes in relation to said receiving device,
displacing said reflector in rotation about at least two distinct axes in relation to said receiving device, and
displacing said receiving device in translation along at least two directions distinct from one another and each distinct from the direction of incidence of said enriched wave on said receiving device.

14. The process as claimed in claim 2, wherein the first electromagnetic source and the second electromagnetic source are integral in rotation with said non-linear object so that the relative position of each source in relation to said non-linear object is constant.

15. A device for power measurement of intermodulation products produced by electromagnetic-wave reflection on a non-linear object, comprising:

a first electromagnetic source configured to emit from a first focal point, a first electromagnetic wave including at least one first fundamental component;
a second electromagnetic source configured to emit, from a second focal point, distinct from the first focal point, a second electromagnetic wave including at least one second fundamental component;
a non-linear object disposed to be irradiated by said first fundamental component and said second fundamental component, and to form an electromagnetic wave that is an enriched wave, wherein the enriched wave includes said first fundamental component, said second fundamental component, and intermodulation components;
an electromagnetic receiving device configured to receive the enriched wave and produce at least one measuring signal that is representative at least of the power of at least one component of the enriched wave,
wherein at a first spatial measuring configuration as part of a first measurement, the receiving device receives a first part having a first composition of the enriched wave and generates a first measuring signal that is representative of the power of at least one component of the first part of the enriched wave, and
wherein at a second spatial measuring configuration different from the first spatial measuring configuration as part of a second measurement, the receiving device receives a second part having a second composition of the enriched wave which is distinct from the first composition of the enriched wave, and generates a second measuring signal that is representative of the power of at least one component of the second part of the enriched wave.

16. The device as claimed in claim 15, further comprising:
a positioning device configured to produce digital position data that are representative of the measuring configurations; and
a data-processing system configured, for any measuring configuration, to receive, and record in a memory, position data in a manner correlated with digital measuring data, that are representative of at least one of the measuring signals produced by said receiving device for a measuring configuration in which said position data have been produced.

17. The device as claimed in claim 15, wherein the first electromagnetic source and the second electromagnetic source are mounted to be integral in rotation with said non-linear object.

18. The device as claimed in claim 16, wherein the first electromagnetic source and the second electromagnetic source are mounted to be integral in rotation with said non-linear object.

19. The device as claimed in claim 15, wherein at least one of the non-linear object and the electromagnetic receiving device is movable relative to the other of the non-linear object and the electromagnetic receiving device to obtain the first spatial measuring configuration and the second spatial measuring configuration.

20. A process for power measurement of intermodulation products produced by reflection of an electromagnetic wave on a non-linear object, using a measuring device including:
a first electromagnetic source emitting from a first focal point a first electromagnetic wave including at least one first fundamental component, a second electromagnetic source emitting from a second focal point, distinct from the first focal point, a second electromagnetic wave including at least one second fundamental component, a non-linear object disposed to be irradiated by said first fundamental component and said second fundamental component, and to form an electromagnetic wave that is an enriched wave including said first fundamental component, said second fundamental component, and intermodulation components, an electromagnetic receiving device configured to receive the enriched wave and produce at least one measuring signal that is representative at least of the power of at least one component of the enriched wave, and the measuring device being disposed in at least one spatial measuring configuration, in which said enriched wave is propagated, at least partly, as far as the receiving device, the enriched wave having a variable composition in space, the process comprising:

emitting, from the first and second electromagnetic sources to the non-linear object, the first and second electromagnetic waves to form the enriched waved; and with the non-linear object and the receiving device arranged in accordance with a first spatial measuring configuration, producing, at the receiving device, a first measuring signal for a first part of the enriched wave in a first measuring step, wherein the first part has a first composition of the enriched wave, and the first measuring signal is representative of the power of the first part of the enriched wave;

modifying position of at least one of the non-linear object and the receiving device from the first spatial measuring configuration to a second spatial measuring configuration different from the first spatial measuring configuration; and producing, at the receiving device, a second measuring signal for a second part of the enriched wave in a second measuring step with the non-linear object and the receiving device arranged in the second spatial measuring configuration, wherein the second part of the enriched wave has a second composition distinct from the first composition of the enriched wave, and the second measuring signal is representative of the power of the second part of the enriched wave.

* * * * *